(12) United States Patent
Feng et al.

(10) Patent No.: US 7,161,448 B2
(45) Date of Patent: Jan. 9, 2007

(54) ACOUSTIC RESONATOR PERFORMANCE ENHANCEMENTS USING RECESSED REGION

(75) Inventors: Hongiun Feng, Windsor, CO (US); Ronald S. Fazzio, Loveland, CO (US); Paul D. Bradley, Menlo Park, CA (US); Richard C. Ruby, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 176 days.

(21) Appl. No.: 10/867,540

(22) Filed: Jun. 14, 2004

(65) Prior Publication Data

US 2005/0275486 A1 Dec. 15, 2005

(51) Int. Cl.
*H03H 9/15* (2006.01)
*H03H 9/54* (2006.01)

(52) U.S. Cl. ................ 333/187; 333/189; 310/312

(58) Field of Classification Search ............... 333/187, 333/188; 310/312
See application file for complete search history.

(56) References Cited

U.S. PATENT DOCUMENTS

| | | | |
|---|---|---|---|
| 3,582,839 A | 6/1971 | Pim et al. | 333/191 |
| 4,320,365 A | 3/1982 | Black et al. | 333/187 |
| 5,587,620 A | 12/1996 | Ruby et al. | 310/346 |
| 6,060,818 A | 5/2000 | Ruby et al. | 310/363 |
| 6,215,375 B1 | 4/2001 | Larson, III et al. | 333/187 |
| 6,262,637 B1 | 7/2001 | Bradley et al. | 333/133 |
| 6,384,697 B1 | 5/2002 | Ruby | 333/189 |
| 6,424,237 B1 | 7/2002 | Ruby et al. | 333/189 |
| 6,472,954 B1 | 10/2002 | Ruby et al. | 333/133 |
| 6,476,536 B1 | 11/2002 | Pensala | 310/312 |
| 6,534,900 B1 | 3/2003 | Aigner et al. | 310/326 |
| 6,600,390 B1 | 7/2003 | Frank | 333/189 |
| 6,657,363 B1 | 12/2003 | Aigner | 310/324 |
| 6,693,500 B1 | 2/2004 | Yang et al. | 333/189 |
| 6,710,508 B1 | 3/2004 | Ruby et al. | 310/312 |
| 6,714,102 B1 | 3/2004 | Ruby et al. | 333/189 |
| 6,720,844 B1 | 4/2004 | Lakin | 333/189 |
| 6,720,846 B1 | 4/2004 | Iwashita et al. | 333/193 |
| 6,788,170 B1 * | 9/2004 | Kaitila et al. | 333/187 |
| 6,812,619 B1 * | 11/2004 | Kaitila et al. | 310/320 |
| 6,842,088 B1 * | 1/2005 | Yamada et al. | 333/187 |
| 2003/0141946 A1 | 7/2003 | Ruby et al. | 333/187 |
| 2004/0263287 A1 | 12/2004 | Ginsburg et al. | 333/187 |
| 2005/0012570 A1 | 1/2005 | Korden et al. | 333/189 |
| 2005/0030126 A1 | 2/2005 | Inoue et al. | 333/133 |

FOREIGN PATENT DOCUMENTS

| | | |
|---|---|---|
| WO | WO 01/06647 | 1/2001 |
| WO | WO 01/99276 A1 | 12/2001 |

OTHER PUBLICATIONS

A partial copy of GB Search Report for Application No. GB0522393.8 mailed Jan. 9, 2006 (4 pgs.).

* cited by examiner

*Primary Examiner*—Barbara Summons

(57) ABSTRACT

An acoustic resonator includes a substrate, a first electrode, a layer of piezoelectric material, a second electrode, and a recessed region. The substrate has a first surface. The first electrode is adjacent the first surface of the substrate. The layer of piezoelectric material is adjacent the first electrode. The second electrode is adjacent the layer of piezoelectric material. The second electrode has a second electrode perimeter that is shaped as a polygon. The recessed region is adjacent the second electrode. The recessed region has a shape defining a recessed region perimeter. The recessed region perimeter is recessed relative to the second electrode perimeter.

18 Claims, 4 Drawing Sheets

ACOUSTIC RESONATOR PERFORMANCE ENHANCEMENTS USING RECESSED REGION

BACKGROUND

The need to reduce the cost and size of electronic equipment has caused a need for smaller signal filtering elements. Thin Film Bulk Acoustic Resonators (FBARs) and Stacked Thin Film Bulk Wave Acoustic Resonators (SBARs) represent one class of filter element with potential for meeting these needs. These filters can collectively be referred to as FBARs. A FBAR is constructed from acoustic resonators using bulk longitudinal acoustic waves in thin film piezoelectric (PZ) material. Typically, a FBAR includes a layer of PZ material sandwiched between two metal electrodes. The combination PZ material and electrodes are suspended in air by supporting the combination around its parameter.

When an electric field is created between the two electrodes, the PZ material converts some of the electrical energy into mechanical energy in the form of acoustic waves. The acoustic waves propagate in the same direction as the electric field and reflect off the electrode-air interface at some frequency including at a resonance frequency. At the resonance frequency, the device can be used as an electronic resonator. Multiple FBARs can be combined such that each are elements in RF filters.

Ideally, the resonant energy is "trapped" in this longitudinal mode. However, in practice, parasitic lateral modes (and other non-longitudinal modes) exist. These modes act to take out energy from the desired longitudinal mode. Furthermore, some of these parasitic modes are quite lossy as they are impacted by the edges of the resonator. This loss is manifested by both sharp "high-Q" modes (which look like "rattles" in the Q circle) and by "low-Q" lossy modes (a more broad-band loss).

For these and other reasons, a need exists for the present invention.

SUMMARY

One aspect of the present invention provides an acoustic resonator including a substrate, a first electrode, a layer of piezoelectric material, a second electrode, and a recessed region. The substrate has a first surface. The first electrode is adjacent the first surface of the substrate. The layer of piezoelectric material is adjacent the first electrode. The second electrode is adjacent the layer of piezoelectric material. The second electrode has a second electrode perimeter that is shaped as a polygon. The recessed region is adjacent the second electrode. The recessed region has a shape defining a recessed region perimeter. The recessed region perimeter is recessed relative to the second electrode perimeter.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
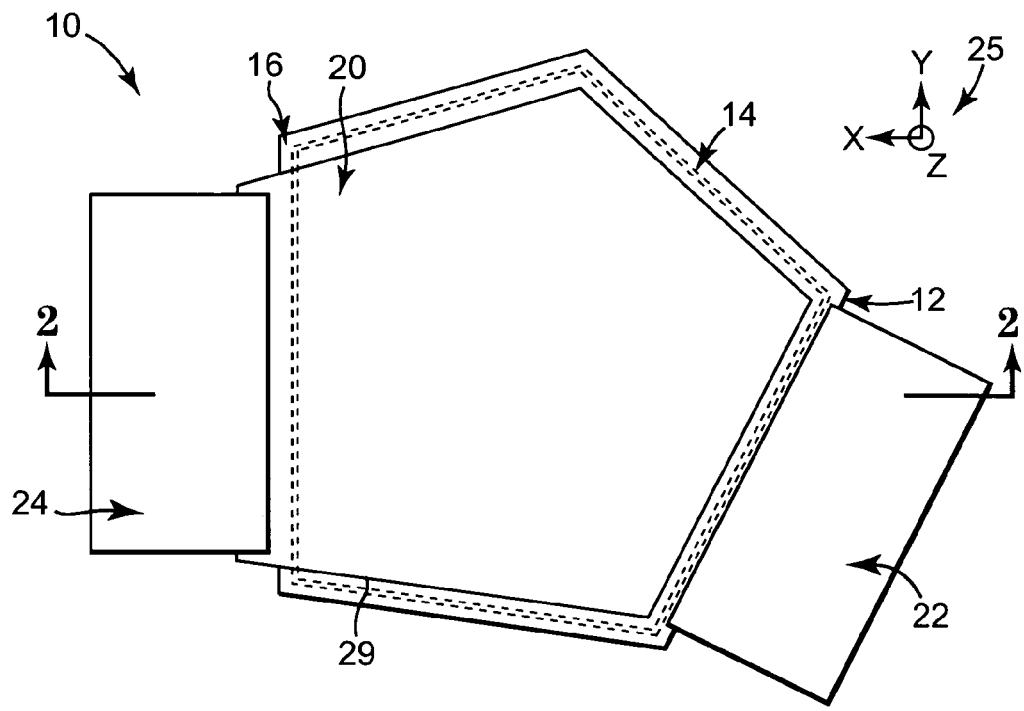
FIG. 1 is top view of an FBAR according to one embodiment of the present invention.
Figure 2:
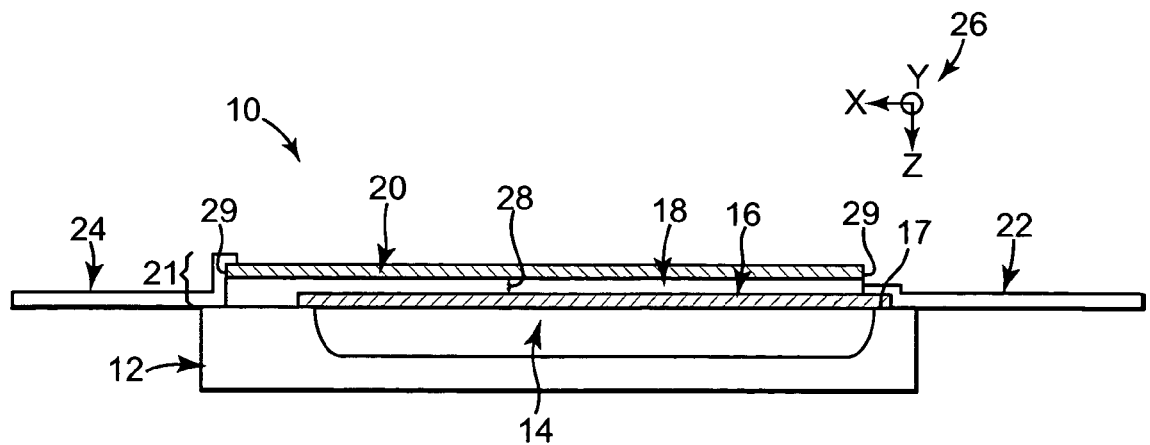
FIG. 2 is a cross-sectional view of the FBAR of FIG. 1 as viewed generally along line 2—2 in FIG. 1.

FIGS. 1 and 2 illustrate one embodiment of FBAR 10. FBAR 10 may be used as a filter element and is one form of acoustic resonator according to one embodiment of the present invention. Other forms of acoustic resonators may also be used as filter elements according to other embodiments of the present invention. For example, the present invention could be used in association with a solidly mounted resonator (SMR) or other acoustic resonator.

FIG. 1 is a top view of FBAR 10 and FIG. 2 is a cross-sectional view taken generally along line 2—2 in FIG. 1. FBAR 10 includes substrate 12, depression 14, first electrode 16, piezoelectric (PZ) layer 18, and second electrode 20. Second electrode 20 has edges 29. In addition, a first contact 22 is coupled to first electrode 16 and second contact 24 is coupled to second electrode 20. First and second contacts 22 and 24 facilitate connecting the first and second electrodes 16 and 20 to a source of voltage.

First electrode 16, PZ layer 18, and second electrode 20 collectively form FBAR membrane 21. FBAR membrane 21 is adjacent surface 17 of substrate 12 and suspended over depression 14 to provide an electrode/air interface. In one embodiment, depression 14 is created by etching away a portion of substrate 12. Depression 14 is deep enough so that a sufficient electrode/air interface is created under FBAR membrane 21. Depression 14 has a perimeter that is illustrated by a dashed line in FIG. 1.

In one embodiment, substrate 12 is made of silicon (Si) and PZ layer 18 is made from aluminum nitride (AlN). Alternatively, other piezoelectric materials may be used for PZ layer. In one embodiment, first and second electrodes 16 and 20 may be made of molybdenum (Mo). Alternatively, other materials may be used for the electrodes. In one embodiment, first and second contacts 22 and 24 may be made of gold (Au). Alternatively, other materials may be used for the contacts.

Coordinate system 25, with respect to FIG. 1 and coordinate system 26, with respect to FIG. 2, are oriented such that the z-axis corresponds to longitudinally-directed acoustic waves of any mode type, while x-axis and y-axis refer to transversely-directed acoustic waves of the compression or sheer-mode type. FBAR 10 is designed to use bulk compression or sheer acoustic waves propagating in a direction parallel z-axis in the thin film piezoelectric material as the desired resonator mode. When an electric field is created between first and second electrodes 16 and 20 via an impressed voltage, the piezoelectric material converts some of the electrical energy into mechanical energy in the form of acoustic waves. The acoustic waves propagate in the same direction as the electric field shown at 28 and reflect off the electrode/air interface parallel to the z-axis.

At the mechanical resonance, the device appears to be an electronic resonator. The mechanical resonant frequency is the frequency for which the half-wave length of the acoustic waves traveling in the device is equal to the total thickness of the device for a given composite phase velocity of sound in the material. Since the velocity of sound is four orders of magnitude smaller than the velocity of light, the resulting resonator can be quite compact. Resonators for applications in the gigahertz (GHz) range may be constructed with physical dimensions on the order of 100 microns in length and a few microns in thickness.

When a band pass filter is designed using FBAR 10, it will pass signals in a certain frequency ranges and reject signals outside those ranges. For example, an FBAR 10 band pass filter may be designed to pass signals having a frequency range of 1.89 to 1.91 GHz and to reject other signals outside that range. The pass band of a filter using FBAR resonators (resonators that only have the pure longitudinal mode) would have a frequency response in the pass band that would be quite smooth as a function of frequency. However, excitation of the longitudinal acoustic modes in the FBAR resonator also excites lateral modes.

Excitation of these lateral modes can then couple energy out of the resonator through a variety of means. Poor matching and boundary conditions at edge 29 of the second layer 20 allow energy to be dissipated by either heat or by energy "dribbling" out into the piezoelectric region. In either case, the energy is not recoverable and hence lost to the system. This energy loss accounts for degraded quality factor, or "Q", of the device. The addition of the "high-Q" lossy modes creates very sharp peaks and valleys and the addition of the "low-Q" lossy modes create a sag in the pass band response that, overall, degrades the pass band response of the filter.

Figure 3:
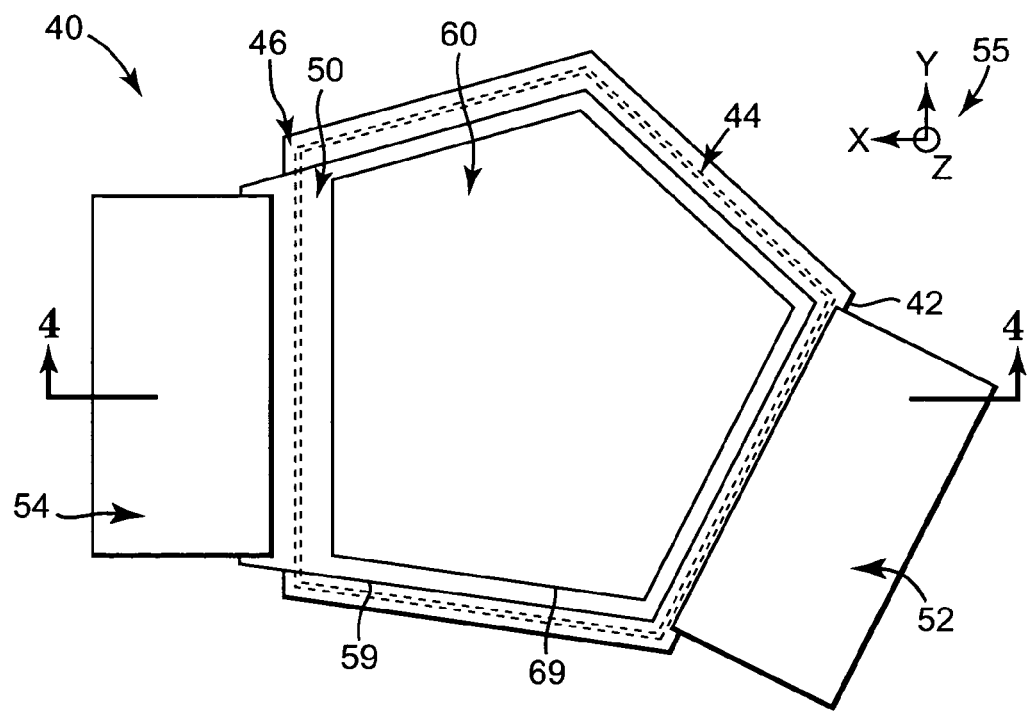
FIG. 3 is top view of an FBAR according to another embodiment of the present invention.
Figure 4:
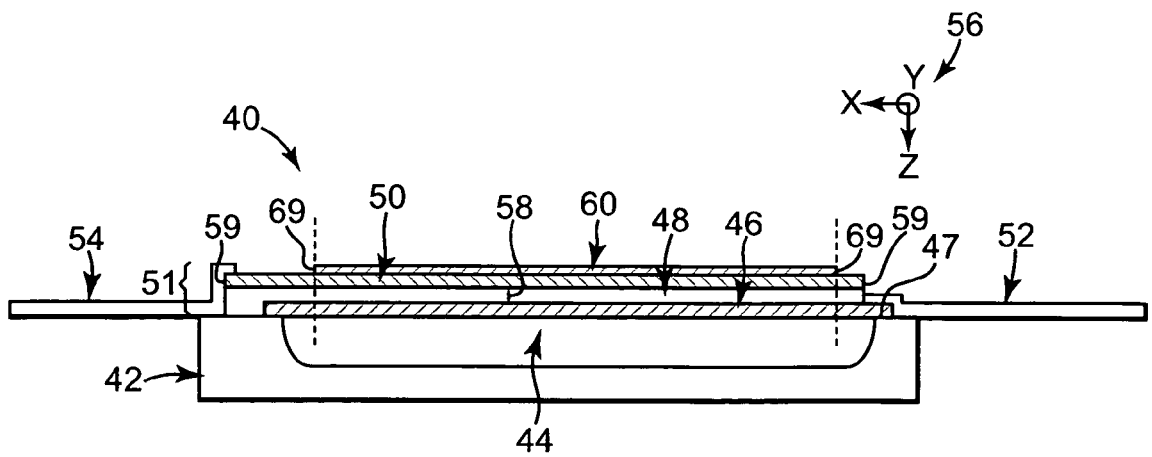
FIG. 4 is a cross-sectional view of the FBAR of FIG. 3 as viewed generally along line 4—4 in FIG. 3.

FIGS. 3 and 4 illustrate an embodiment of FBAR 40 in accordance with the present invention. FIG. 3 is a top view of FBAR 40 and FIG. 4 is a cross-sectional view taken generally along line 4—4 in FIG. 3. FBAR 40 includes substrate 42, depression 44, first electrode 46, piezoelectric (PZ) layer 48, second electrode 50 and recessed region 60. Edges 59 of second electrode 50 and edges 69 of recessed region 60 are also illustrated. In addition, a first contact 52 is coupled to first electrode 46 and second contact 54 is coupled to second electrode 50. First and second contacts 52 and 54 facilitate connecting the first and second electrodes 46 and 50 to a source of voltage.

First electrode 46, PZ layer 48, second electrode 50 and recessed region 60 collectively form FBAR membrane 51. FBAR membrane 51 is adjacent surface 47 of substrate 42 and suspended over depression 44 to provide an electrode/air interface. In one embodiment, depression 44 is created by etching away a portion of substrate 42. Depression 44 is deep enough so that a sufficient electrode/air interface is created under FBAR membrane 51. In one embodiment, it is on the order of a few microns in depth. Depression 44 has a perimeter that is illustrated by a dashed line in FIG. 3.

In one embodiment, substrate 42 is made of silicon (Si) and PZ layer 48 is made from aluminum nitride (AlN). Alternatively, other piezoelectric materials may be used for PZ layer. In one embodiment, first and second electrodes 46 and 50 may be made of molybdenum (Mo). Alternatively, other materials may be used for the electrodes. In one embodiment, first and second contacts 52 and 54 may be made of gold (Au). Alternatively, other materials may be used for the contacts.

In one embodiment, first electrode 46 is formed on a portion of surface 47 of substrate 42 so that it spans depression 44. PZ layer 48 is then formed over first electrode 46, second electrode 50 is formed over PZ layer 48 and recessed region 60 is formed over second electrode 50. First and second electrodes 46 and 50 are formed using deposition process. Recessed region 60 may then be formed over second electrode 50 by a lift-off process. For the lift-off process, after second electrode 50 is deposited, the entire wafer is covered with photo resist except in an area in which recessed region 60 is to be formed, thereby creating a mask or patterned area. In this patterned area, the recessed region 60 is then formed and the photo resist is washed away after recessed region 60 is formed.

Recessed region 60 could be made of Mo material, just as first and second electrodes 46 and 50, or the group of metals belonging to Mo. It could also be made of other materials, such as AlN, Platinum, polyimide, BCB (benzocyclobutene), $SiO_2$, $Si_3N_4$, and other dielectrics, ZnO, $LiNbO_3$, PZT, $LiTaO_3$, $Al_2O_3$, and other piezoelectric materials.

In another embodiment, recessed region 60 may be formed over second electrode 50 by an etching process. In the etching process, an initial thickness of recessed region 60 is established and then material is etched away at the edges to form the final dimensions of recessed region 60.

In addition to recessed region 60 being placed on top of second electrode 50 using a separate metalization lift-off or metal deposition and etch process, the same effect may be achieved by etching a recessed feature into second electrode 50. In other words, one embodiment of FBAR 40 includes recessed region 60 and second electrode 50 that are initially formed as a single layer. In this way, combined second electrode 50 and recessed region 60 may be formed of the same material at the same time over PZ layer 48 using deposition process. Then, material may be etched away at the edges just in the upper portion of the combined deposited layer thereby defining the final dimensions of recessed region 60.

Coordinate system 56, with respect to FIG. 4 and coordinate system 55, with respect to FIG. 3, are oriented such that the z-axis corresponds to longitudinally-directed acoustic waves of any mode type, while the x-axis and the y-axis referred to transversely-directed acoustic waves of the compression, or sheer-mode type. As with FBAR 10, FBAR 40 is designed to use bulk compression or sheer acoustic waves propagating in a direction parallel to the z-axis in the PZ layer 48 as the desired resonator mode. When an electric field is created between first and second electrodes 46 and 50, the PZ layer 48 converts some of the electrical energy into mechanical energy in the form of acoustic waves. The acoustic waves propagate in the same direction as the electric field shown at 58 and reflect off the electrode-air interface parallel to the z-axis. However, FBAR 40, which provides recessed region 60 over second electrode 50, reduces or suppresses the reflected and lateral acoustic waves, thereby decreasing noise in the filter and improves its performance as a filter.

Figure 5:
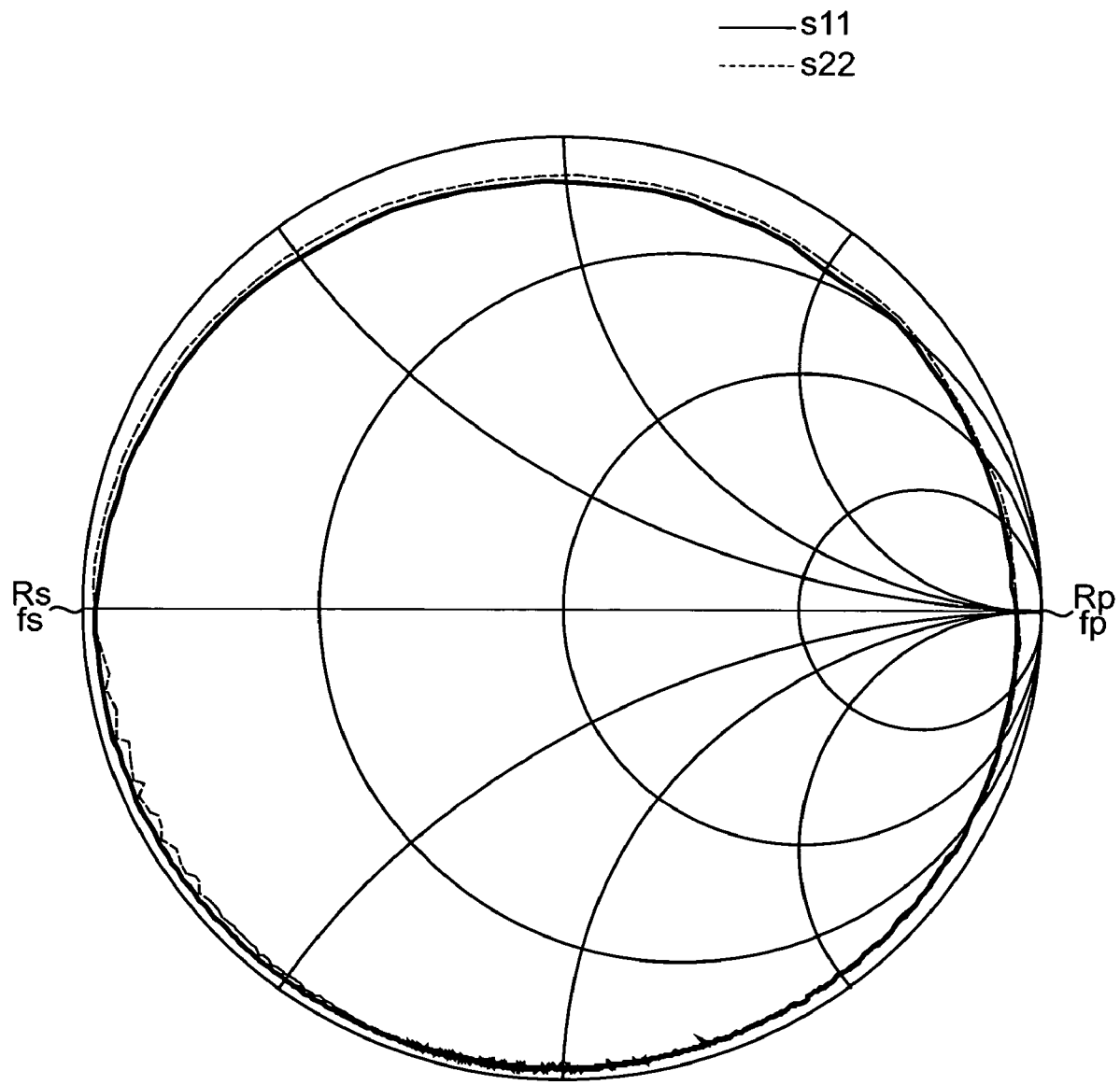
FIG. 5 illustrates Q circles for two exemplary FBARs plotted on a Smith chart.

FIG. 5 illustrates Q circles for two exemplary FBARs plotted on a Smith chart, and illustrates suppression of reflected and lateral modes in one of the FBARs. As is known in the art, a Smith Chart is a polar plot of a complex impedance (used in the following to show measures of s11 and s22 scattering parameters). These s11 and s22 scattering parameters represent a ratio of complex amplitudes of backward and forward waves. The Smith Chart aids in translating the reflection coefficients into impedance and it maps part of the impedance placed into a unit circle.

Generally, the horizontal axis passing through the unit circle represent real impedance, the area above the axis represents inductive reactance and the area below represents capacitive reactance. The left-hand portion of the chart at zero reactance represents series resonance frequency (fs) and occurs where the Q circle crosses the real axes on the left side of the Smith Chart. The right-hand portion of the chart at zero reactance represents parallel resonant frequency (fp) and occurs where the Q circle crosses the real axes on the right side the Smith Chart. The closer that a plot of a FBAR filter characteristics on a Smith Chart is to the perimeter of the Smith Chart, represents a higher Q for that FBAR. Also, the more smooth that the curve is, the lower the noise is in the FBAR.

In FIG. 5, the performance of FBAR 40 as a filter is illustrated by solid line Q circle s11 and the performance of a prior art FBAR without a recessed region is illustrated by dashed line Q circle s22. As evident, FBAR 40 improves the quality of the filter near the series resonance fs. The uneven portions, or squiggles, in Q circle s22, especially in the lower left quadrant of the Smith Chart, illustrates the noise in the prior art FBAR. This loss is manifested by both sharp "high-Q" modes (which look like "squiggles" or "rattles" in the Q circle) and by "low-Q" lossy modes (a more broadband loss). FBAR 40, illustrated by Q circle s22, more closely approximates a circle and is representative of reduction or suppresses the reflected and lateral modes.

In one embodiment, first electrode 46, PZ layer 48, second electrode 50 and recessed region 60, collectively forming FBAR membrane 51, are stacked over substrate 42 in the z-axis direction as illustrated in FIG. 4. In this way, recessed region 60 is in a first plane of the x-y axis and is directly over, and generally parallel to, second electrode 50, which is in a second plane of the x-y axis. Recessed region 60 has an edge 69 defining a perimeter in the first plane of the x-y axis. Similarly, second electrode 50 has an edge 59 defining a perimeter in the second plane of the x-y axis. Edge 59 of recessed region 60 is contained within edge 59 second electrode 50 relative to the first and second planes. In other words, the edge 69 of recessed region 60 is recessed relative to the edge 59 of second electrode 50. As illustrated in FIG. 3, the perimeter of recessed region 60 formed by edge 69 is inside the perimeter of second electrode 50 formed by edge 59. Similarly, as illustrated in FIG. 4, edges 69 of recessed region 60 are inside edges 59 of second electrode 50.

Providing recessed region 60 over second electrode 50, and recessed relative to second electrode 50, creates a discontinuity of FBAR membrane 51. This discontinuity results in reflection of the acoustic wave. This reflected acoustic wave reduces loss around series resonance. This decreases loss in the filter and improves the performance of FBAR 40 as a filter.

Recessed region 60 suppresses energy loss due to the dissipation through mode dispersion. In one embodiment, FBAR 40 can be considered as acting as two FBAR devices on substrate 42. A dominant FBAR region is that portion of FBAR 40 that is stacked on substrate 42 in the z-axis direction in between edges 69, indicated with dotted lines in FIG. 4. A perimeter FBAR region is that portion of FBAR 40 that is stacked on substrate 42 in the z-axis direction outside edges 69. FBAR 40 is designed with a particular resonant frequency for the particular filter application. The dominant FBAR region and perimeter FBAR region may be considered to each have there own parallel and series resonant frequencies.

In one embodiment, FBAR 40 and recessed region 60 are configured such that the series frequency of the dominant FBAR region is 90 to 100 percent of the series frequency of the perimeter FBAR region. This relationship between the dominant FBAR region and perimeter FBAR region provides good suppression of lateral mode excitation for FBAR 40.

In another embodiment of FBAR 40, where FBAR 40 is considered to have a dominant FBAR region and a perimeter FBAR region, FBAR 40 may be configured such that dominant FBAR region and a perimeter FBAR region oscillate at slightly shifted frequencies with respect to each other in order to improve suppression of lateral mode excitation. In one embodiment, FBAR 40 is configured such that dominant FBAR region oscillates at a frequency shifted by about $½k_t^2$ (where $k_t^2$ can range from 3 to 8% for the piezoelectric AlN and over a much broader range depending on other types of piezoelectric materials) from the oscillation frequency of the perimeter FBAR region.

In another embodiment of FBAR 40, the lateral distance in the x-axis direction (illustrated for example in FIG. 4) of between the edge 59 of second electrode 50 and the edge 69 of recessed region 60 are controlled to optimize the FBAR 40 performance. In this embodiment, if the lateral distance between edges 59 and 69 is too large or too small, the suppression of reflected and lateral acoustic modes is decreased or even nonexistent. However, if recessed region 60 is correctly sized, and thus lateral distance between edges 59 and 69 is correspondingly correctly sized, FBAR 40 will have its lateral mode excitation suppressed. In one embodiment, the lateral distance between edges 59 and 69 is about one wavelength of the resonant frequency. For example if the resonant frequency of FBAR 40 is 1900 MHz, the wavelength of FBAR membrane 51 is between 2 and 3 microns. Thus, in this example the lateral distance between edges 59 and 69 is about 2 to 3 microns. In another embodiment, FBAR 40 is configured such that the lateral distance between edges 59 and 69 is in the range of about 0.25 to 2.5 times the wavelength of the resonant frequency. In this case, the lateral distance between edges 59 and 69 is about 0.5 to 7.5 microns.

In another embodiment of FBAR 40, the mass of recessed region 60 relative to the mass of second electrode 50 are controlled to optimize the FBAR 40 performance. In this embodiment, if rectangular-shaped layers are assumed for both recessed region 60 and second electrode 50, the height of recessed region 60 in the z-axis direction times the lateral distance of recessed region 60 in the x-axis direction is 90 to 100 percent of the height of second electrode 50 in the z-axis direction times the lateral distance of second electrode 50 in the x-axis direction. This larger volume, and therefore mass, of the second electrode 50 relative to the recessed region 60 sufficiently dispersed lateral acoustic modes.

In one embodiment, the performance of FBAR 40 as a filter may be enhanced by adjusting recessed region 60 relative to second electrode 50 depending on the particular filter application. Specifically, where relatively higher frequency applications are used, the relative distance from edge 59 of second electrode 50 to edge 69 of recessed region 60 should be decreased, and where relatively lower frequency applications are used, the relative distance from edge 59 of second electrode 50 to edge 69 of recessed region 60 should be increased. In both instances, edge 69 of recessed region 60 remains recessed relative to edge 59 of second electrode 50. Adjusting the relative distance between edges 59 and 69 allows FBAR 40 to be tailored to the particular frequency application, and will decrease losses in the pass band of the filter.

In one embodiment, FBAR 40 is further configured such that recessed region 60 is also recessed relative to the perimeter of depression 44. As indicated earlier, depression 44 has a perimeter that is illustrated by the outer of the double dashed lines in FIG. 3. The layers of FBAR membrane 41, including recessed region 60, are stacked over substrate 42 and depression 44 in the z-axis direction as illustrated in FIG. 4. Again, recessed region 60 is in a first plane of the x-y axis and is directly over, and generally parallel to, second electrode 50, which is in a second plane of the x-y axis. Furthermore, recessed region 60 is also over, and generally parallel to, substrate 42 and depression 44, which are in a third plane of the x-y axis. Recessed region 60 has an edge 69 defining a perimeter in the first plane of the x-y axis. Similarly, depression 44 has a perimeter in the third plane of the x-y axis. In one embodiment of FBAR 40, the perimeter of recessed region 60 is contained within the perimeter of depression 44 relative to the first and third planes. In other words, the perimeter of recessed region 60 is recessed relative to the perimeter of depression 44. This relative relationship may enhance the filter characteristics of FBAR 40 in some applications. In other applications, however, the perimeter of recessed region 60 is not recessed relative to the perimeter of depression 44 and the recessed region will pass over the perimeter of depression 44.

In one alternative embodiment, the present invention may be used with other acoustic resonators. For example, rather than be configured as FBAR membrane 51, the stack may be solidly mounted over an acoustic Bragg reflector that is in place of depression 44 in order to form a SMR. Such an acoustic device configured with recessed region 60 would still provide the advantages of the present invention.

Figure 6:
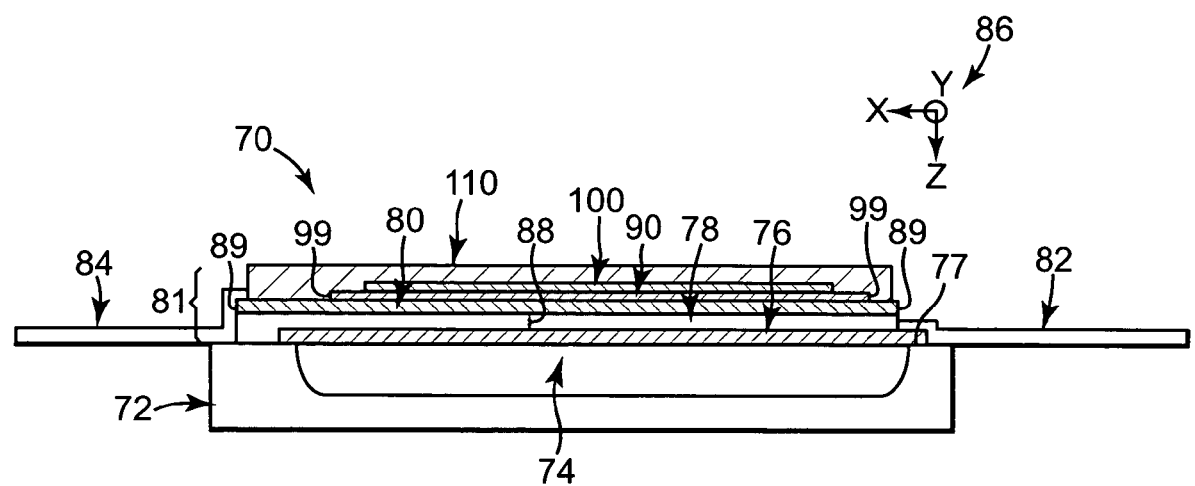
FIG. 6 is a cross-sectional view of an FBAR according to another embodiment of the present invention.

FIG. 6 illustrates FBAR 70 in accordance with the present invention. FBAR 70 includes substrate 72, depression 74, first electrode 76, piezoelectric (PZ) layer 78, second electrode 80, first recessed region 90, second recessed region 100 and passivation layer 110. In addition, a first contact 82 is coupled to first electrode 76 and second contact 84 is coupled to second electrode 80. First and second contacts 82 and 84 facilitate connecting the first and second electrodes 76 and 80 to a source of voltage. First electrode 76, PZ layer 78, second electrode 80, first recessed region 90, and second recessed region 100 collectively form FBAR membrane 81.

Second recessed region 100 is provided over first recessed region 90 to create additional discontinuity of FBAR membrane 81. This additional discontinuity also reduces or suppresses the reflected and lateral acoustic waves thereby decreasing noise in the filter and improves its performance as a filter.

Passivation layer 110 is added over the top of FBAR membrane 81 to protect the membrane. Where Mo material is used for first and second recessed regions 90 and 100, or for first and second electrodes 76 and 80, passivation layer 110 is used to protect Mo oxidation.

One skilled in the art should recognize that additional recessed regions are also possible in accordance with the present invention to provide additional discontinuity of FBAR membrane. Furthermore, although pentagonal-shaped layers are generally shown for the FBAR membrane, including the recessed regions, other polygon-shaped membranes are well-used in accordance with the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An acoustic resonator comprising:
    a substrate having a first surface;
    a first electrode adjacent the first surface of the substrate;
    a layer of piezoelectric material adjacent the first electrode;
    a second electrode adjacent the layer of piezoelectric material, the second electrode having a second electrode outer perimeter that is shaped as a polygon; and
    a recessed region adjacent the second electrode, wherein the recessed region has a height relative to the second electrode, wherein the recessed region height defines a recessed region outer perimeter, and wherein the recessed region outer perimeter is recessed relative to the second electrode outer perimeter.

2. The acoustic resonator of claim 1 wherein a depression is formed in the first surface of the substrate and wherein the first electrode spans the depression.

3. The acoustic resonator of claim 2 further comprising:
    a dominant region that includes a portion of the first electrode, a portion of the layer of piezoelectric material, a portion of the second electrode and the recessed region, the dominant region having a series frequency; and
    a perimeter region that includes a portion of the first electrode, a portion of the layer of piezoelectric material, and a portion of the second electrode, the perimeter region having a series frequency;
    wherein the series frequency of the dominant region is 90 to 100 percent of the series frequency of the perimeter region.

4. The acoustic resonator of claim 2 wherein acoustic resonator has a resonant frequency and wherein the distance from the recessed region perimeter to the second electrode perimeter is one wavelength of the resonant frequency.

5. The acoustic resonator of claim 2 wherein acoustic resonator has a resonant frequency and wherein the distance from the recessed region perimeter to the second electrode perimeter is about 0.25 to 2.5 times the wavelength of the resonant frequency.

6. The acoustic resonator of claim 2 wherein acoustic resonator has a resonant frequency and wherein the distance from the recessed region perimeter to the second electrode perimeter is about 0.5 to 7.5 microns.

7. The acoustic resonator of claim 2 wherein the mass of the recessed region is 90 to 100 percent of the mass of the second electrode.

8. The acoustic resonator of claim 2 further comprising a second recessed region adjacent the recessed region, the second recessed region having a shape defining a second recessed region perimeter, wherein the second recessed region perimeter is recessed relative to the second electrode perimeter.

9. The acoustic resonator of claim 8 wherein the second recessed region perimeter is recessed relative to the recessed region perimeter.

10. The acoustic resonator of claim 2 wherein the depression has a shape defining a depression perimeter and wherein the recessed region perimeter is recessed relative to the depression perimeter.

11. An acoustic resonator comprising:
a substrate having a first surface:
a first electrode over the first surface of the substrate:
a layer of piezoelectric material over the first electrode:
a second electrode over the layer of piezoelectric material, wherein the second electrode has a second electrode perimeter that is shaped as a polygon and wherein the first electrode, layer of piezoelectric material and the second electrode collectively form a membrane;
means for creating a discontinuity of the membrane such that excitation of lateral modes are suppressed;
wherein the means for creating a discontinuity comprises a first recessed region having a first recessed region perimeter and wherein the first recessed region perimeter is recessed relative to the second electrode perimeter; and
wherein the means for creating a discontinuity further comprises a second recessed region adjacent the first recessed region, the second recessed region having a shape defining a second recessed region perimeter, wherein the second recessed region perimeter is recessed relative to the second electrode perimeter.

12. The acoustic resonator of claim 11 further including a dominant region having a series frequency and a perimeter region having a series frequency wherein the series frequency of the dominant region is 90 to 100 percent of the series frequency of the perimeter region.

13. The acoustic resonator of claim 11 wherein acoustic resonator has a resonant frequency and wherein the distance from the first recessed region perimeter to the second electrode perimeter is about 0.25 to 2.5 times the wavelength of the resonant frequency.

14. The acoustic resonator of claim 11 wherein acoustic resonator has a resonant frequency and wherein the distance from the first recessed region perimeter to the second electrode perimeter is about 0.5 to 7.5 microns.

15. The acoustic resonator of claim 11 wherein the mass of the first recessed region is 90 to 100 percent of the mass of the second electrode.

16. The acoustic resonator of claim 11 further comprising a depression having a shape defining a depression perimeter and wherein the first recessed region perimeter is recessed relative to the depression perimeter.

17. A method for fabrication of an acoustic resonator comprising:
providing a substrate with a surface;
depositing a first electrode adjacent the surface of the substrate;
forming a layer of piezoelectric material adjacent the first electrode;
depositing a second electrode adjacent the layer of piezoelectric material, the second electrode deposited with a thickness such that its thickness has a second electrode outer perimeter that is shaped as a polygon; and
forming a recessed region adjacent the second electrode, the recessed region formed with a thickness such that its thickness defining a recessed region outer perimeter; wherein the recessed region outer perimeter is formed to be recessed relative to the second electrode outer perimeter.

18. The method of claim 17 wherein forming a recessed region is formed of a material selected from the group comprising AlN, Mo, Platinum, polyimide, BCB, $SiO_2$, $Si_3N_4$, ZnO, $LiNbO_3$, PZT, $LiTaO_3$, and $Al2O_3$.

* * * * *